(12) United States Patent
Ando et al.

(10) Patent No.: US 11,502,252 B2
(45) Date of Patent: Nov. 15, 2022

(54) RESISTIVE SWITCHING MEMORY CELL

(71) Applicant: International Business Machines Corporation, Armonk, NY (US)

(72) Inventors: Takashi Ando, Eastchester, NY (US); Praneet Adusumilli, Somerset, NJ (US); Reinaldo Vega, Mahopac, NY (US); Cheng Chi, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 16/952,203

(22) Filed: Nov. 19, 2020

(65) Prior Publication Data

US 2022/0158091 A1    May 19, 2022

(51) Int. Cl.
  *H01L 45/00*  (2006.01)
  *H01L 27/24*  (2006.01)
  *G06N 3/063*  (2006.01)
  *G06N 3/04*  (2006.01)

(52) U.S. Cl.
  CPC ........... *H01L 45/1273* (2013.01); *G06N 3/04* (2013.01); *G06N 3/063* (2013.01); *H01L 27/2436* (2013.01); *H01L 45/08* (2013.01); *H01L 45/1233* (2013.01); *H01L 45/146* (2013.01); *H01L 45/16* (2013.01)

(58) Field of Classification Search
  CPC ...................................................... H01L 45/00
  See application file for complete search history.

(56) References Cited

U.S. PATENT DOCUMENTS

| | | | |
|---|---|---|---|
| 8,420,478 B2 | 4/2013 | Chiang et al. | |
| 9,553,265 B1 | 1/2017 | Yang et al. | |
| 10,056,266 B2 | 8/2018 | Dieny et al. | |
| 10,490,745 B2 | 11/2019 | Sun et al. | |
| 2013/0248809 A1 | 9/2013 | Tamai et al. | |
| 2016/0149128 A1 | 5/2016 | Bodke | |
| 2017/0250222 A1 | 8/2017 | Wu | |
| 2020/0203603 A1 | 6/2020 | Glassman et al. | |

FOREIGN PATENT DOCUMENTS

| | | |
|---|---|---|
| CN | 102738386 A | 10/2012 |
| CN | 103035840 A | 4/2013 |
| WO | 2015006104 A1 | 1/2015 |
| WO | 20180046711 W | 1/2018 |

OTHER PUBLICATIONS

International Search Report and Written Opinion for Application PCT/CN2021/123123, dated Jan. 19, 2022, 8 pages.
Chen et al. "Enhancement of Resistive Switching Characteristics in Al2O3-Based RRAM With Embedded Ruthenium", Article in IEEE Electron Device Letters, Research Gate, Jul. 2011, 4 pages.
Pan et al., "1Kbit FINFET Dielectric (Find) RRAM in Pure 16nm FinFET CMOS Logic Process", IEEE, IEDM15-258, 2015, 4 pages.
Hayakawa et al., "Highly reliable TaOx ReRAM with centralized filament for 28-nm embedded application", 2015 Symposium on VLSI Technology Digest of Technical Papers, 2-2, 2 pages.

*Primary Examiner* — Marvin Payen
(74) *Attorney, Agent, or Firm* — Jeffrey M. Ingalls (57) ABSTRACT

A resistive random access memory (ReRAM) device is provided. The ReRAM device includes a first electrode, a first resistive structure in contact with the first electrode, a dielectric layer in contact with the first resistive structure, and a second resistive structure in contact with the dielectric layer. The second resistive structure includes a resistive material layer and a high work function metal core. The ReRAM device also includes a second electrode in contact with the second resistive structure.

20 Claims, 10 Drawing Sheets

RESISTIVE SWITCHING MEMORY CELL

BACKGROUND

The present disclosure generally relates to fabrication methods and resulting structures for semiconductor based electronic devices. More specifically, the present disclosure relates to a resistive random access memory (ReRAM) cell structure having an integrated access transistor and a high density layout for neuromorphic computing, the ReRAM cell having reduced programming voltages.

ReRAM structures can be used as a type of non-volatile (NV) random-access memory (RAM) in computing resources. ReRAM devices having a simple metal-insulator-metal structure show promising characteristics in terms of scalability, low power operation, and multilevel data storage capability, and they may be suitable for next-generation memory applications. ReRAM typically operates by controlled changes in resistance across a dielectric solid-state material. The dielectric solid-state material may be referred to as a memristor. ReRAM may be considered as a promising technology for electronic synapse devices (or memristors) for neuromorphic computing as well as high-density and high-speed non-volatile memory applications. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of ReRAMs, which may enable a fully-connected neural network.

Oxygen vacancies in a metal oxide layer of a ReRAM device are the building blocks of a current conducting filament. Therefore, it may be desirable to form ReRAM cells without introducing damage in a perimeter area thereof. Moreover, it may be desirable to form ReRAM cells with a robust encapsulation to prevent oxygen penetration during the subsequent processes.

SUMMARY

Embodiments of the present disclosure relate to a resistive random access memory (ReRAM) device. The ReRAM device includes a first electrode, a first resistive structure in contact with the first electrode, a dielectric layer in contact with the first resistive structure, and a second resistive structure in contact with the dielectric layer. The second resistive structure includes a resistive material layer and a high work function metal core. The ReRAM device also includes a second electrode in contact with the second resistive structure.

Other embodiments relate to a method of fabricating a resistive random access memory (ReRAM) device. The method includes forming a first electrode, forming a first resistive structure in contact with the first electrode, forming a dielectric layer in contact with the first resistive structure, and forming a second resistive structure in contact with the dielectric layer, the second resistive structure including a resistive material layer and a high work function metal core. The method also incudes forming a second electrode in contact with the second resistive structure.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

The present disclosure generally relates to fabrication methods and resulting structures for semiconductor-based electronic devices. More specifically, the present disclosure relates to resistive random access memory (ReRAM) cell structures with an integrated access transistor and a high density layout that may be used in neuromorphic computing applications, and methods of fabricating such ReRAM devices.

The flowcharts and cross-sectional diagrams in the Figures illustrate methods of manufacturing ReRAM devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, in neuromorphic computing applications, a resistive memory device (e.g., a ReRAM device) can be used as a connection (synapse) between a pre-neuron and post-neuron, representing the connection weight in the form of device resistance.

Multiple pre-neurons and post-neurons can be connected through a crossbar array of RRAMs, which naturally expresses a fully-connected neural network.

A crossbar array of RRAM can be made with junction with resistively switching material formed on the bottom electrodes. The top electrodes are formed on the junction with resistively switching material to form a crossbar array of RRAMs.

Non-volatile resistively switching metal oxides, such as $HfO_x$, $TaO_x$, and $TiO_x$, are integrated into nano-crossbar arrays and nano-cross-points defined by lithography techniques. This enables a fast fabrication route for high density prototype test structures of passive memory cores with two terminal devices. The structures and the integrated material is electrically characterized to gain an insight into the general properties of nano-crossbar arrays with resistively switching metal oxides and to define the demands for an external CMOS control system.

Nonvolatile and resistively switching materials with two stable states such as $HfO_2$ are integrated as two terminal memory devices to efficiently create a ReRAM bit pattern. These cells can be integrated into crossbar arrays. The switching material present at every junction at a cross point is an addressable cell of a ReRAM. Since the array consists of passive elements, additional active external circuitry is required for the operation to address the cells, set, and reset their state and read the stored information.

Artificial neural networks (ANNs) can be formed from crossbar arrays of resistive processing units (RPUs) that provide local data storage and local data processing without the need for additional processing elements beyond the RPU. The trainable resistive crosspoint devices are referred to as RPUs.

The neurons are integrated in CMOS circuitry with cross bar array of devices, which stores a matrix. The input neurons, along with the hidden neuron layers and output neurons form a neural network. Input signals can be forwarded, backward and forward through the network and also can be used to update the weights in the matrix.

Crossbar arrays (crosspoint arrays or crosswire arrays) are high density, low cost circuit architectures used to form a variety of electronic circuits and devices, including ANN architectures, neuromorphic microchips, and ultra-high density nonvolatile memory. A basic crossbar array configuration includes a set of conductive row wires and a set of conductive column wires formed to intersect the set of conductive row wires. The intersections between the two sets of wires are separated by so-called crosspoint devices, which may be formed from thin film material. Crosspoint devices, in effect, function as the ANN's weighted connections between neurons. Nanoscales two-terminal devices, for example memristors having conduction state switching characteristics, are often used as the crosspoint devices in order to emulate synaptic plasticity with high energy efficiency. The conduction state (e.g., resistance) of the memristive material may be altered by controlling the voltages applied between individual wires of the row and column wires.

The Resistive Processing Unit (RPU) can further enhance the functionality of neuromorphic computing. The new class of devices (RPU) that can be used as processing units to accelerate various algorithms including neural network training.

In certain of the present embodiments, the ReRAM devices include a metal oxide layer positioned between a top electrode and a bottom electrode (i.e., a metal-insulator-metal structure). Oxygen vacancies in the metal oxide layer allow for the electroformation of a current conducting filament (CF) therein. In many ReRAM devices, the mechanism enabling the storage of information is based on the formation and rupture of this CF formed between the two electrodes, resulting in repeatable resistive switching between high resistance states (HRS) and low resistance states (LRS). With regard to the CF, when an oxide metal is sandwiched between two electrodes, when a sufficient positive voltage is applied to the top electrode, the CF will form between the two electrodes, resulting in a low resistance state. In contrast, when a sufficient negative voltage is applied to the bottom electrode, the CF breaks, resulting in a high resistance state. In certain embodiments of the oxide ReRAM device, the formation of the CF is triggered by field-assisted oxygen ion migrations, resulting in a change in the electronic conductivity (or resistivity) of the switching device, as discussed above. For oxide ReRAM devices, the electroforming of the CF is needed.

The process of forming the conductive filament may rely on a certain amount of randomness and the position of the created filament may not always be well controlled. This may result in the need for a higher forming voltage as the ReRAM cell is scaled, and this may lead to higher device variability. In certain ReRAM devices, Si implantation may be used after the post pillar reactive ion etching (RIE) process, and this may allow for a significant reduction in the CF forming voltage.

Figure 1:
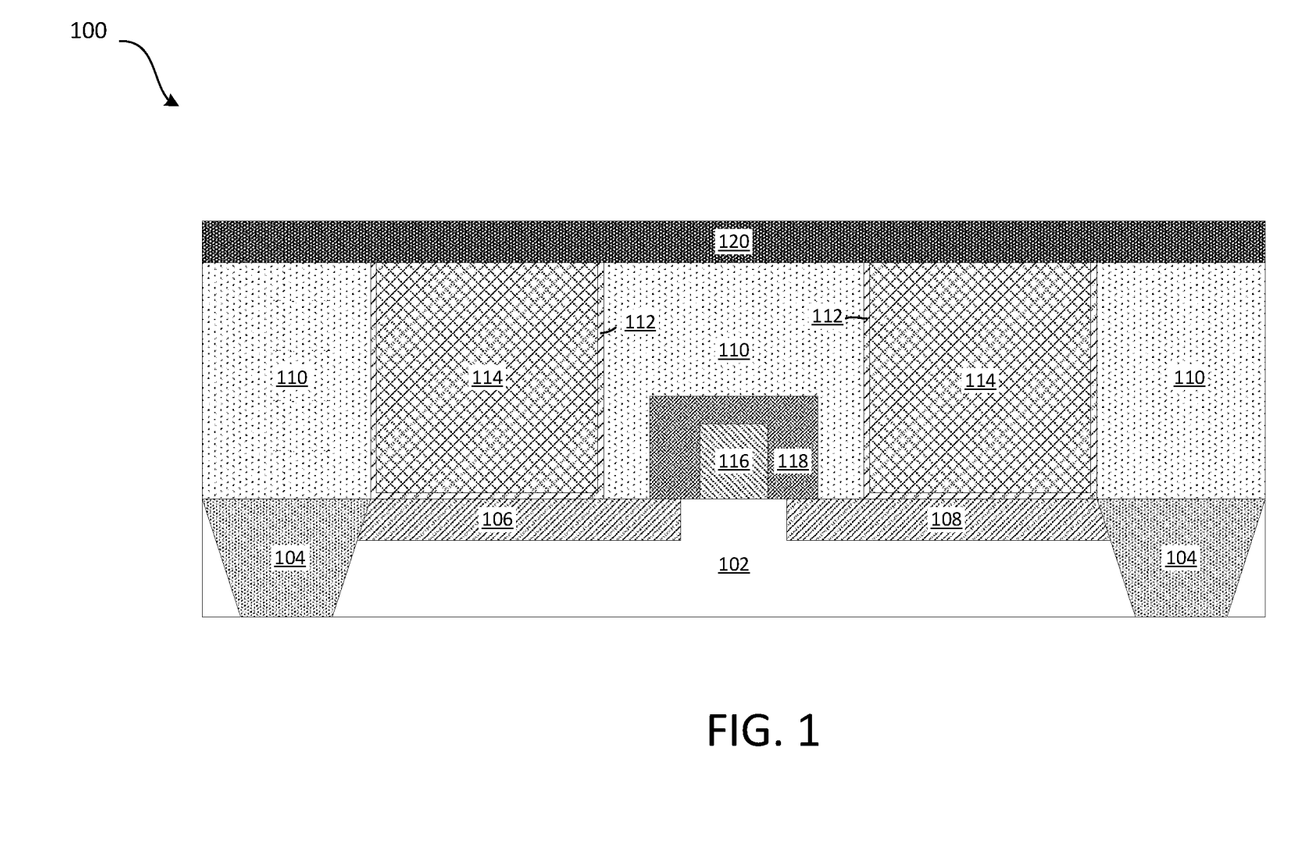
FIG. 1 is a cross-sectional view of a ReRAM device at an intermediate stage of the manufacturing process, according to embodiments.

Referring now to the drawings in which like numerals represent the same or similar elements and initially to FIG. 1, this figure is a cross-sectional view of a ReRAM device in an intermediate stage of the manufacturing process, in accordance with certain embodiments. As shown in FIG. 1, the ReRAM device 100 includes a substrate 102. The semiconductor substrate 102 may include any semiconductor material that has semiconducting properties. The semiconductor material that provides semiconductor substrate 102 may include, for example, silicon (Si), germanium (Ge), a silicon germanium alloy (SiGe), silicon carbide (SiC), silicon germanium carbide (SiGeC), a III-V compound semiconductor or a II-VI compound semiconductor. Shallow trench isolation (STI) regions 104 are formed into the substrate 102 and they function to isolate one transistor from another transistor. A source region 106 and a drain region 108 are formed and are doped areas of the silicon substrate 102. A gate electrode 116 is formed on the substrate 102 in a region between the source region 106 and the drain region 108. A dielectric spacer 118 is formed around the gate electrode 116. The dielectric spacer 118 may comprise SiN or any other suitable type of dielectric material. A first interlayer dielectric (ILD) layer 110 is formed on the substrate 102 over the STI regions 104, the source region 106, the drain region 108 and the dielectric spacer 118. Although not shown in FIG. 1, vias are first formed in the first ILD layer 110 to accommodate the formation of bottom electrodes which include a via liner layer 112 and a via core 114. The via liner layer 112 may include TaN or TiN, or any other suitable material. The via core 114 may include, for example, W. After the formation of the bottom electrodes, the ReRAM device 100 may be subjected to a chemical-mechanical planarization (CMP) to planarize the upper surface of the device. A first SiN layer 120 is then formed on the top of the first ILD layer 110 and the tops of the via cores 114.

Figure 2:
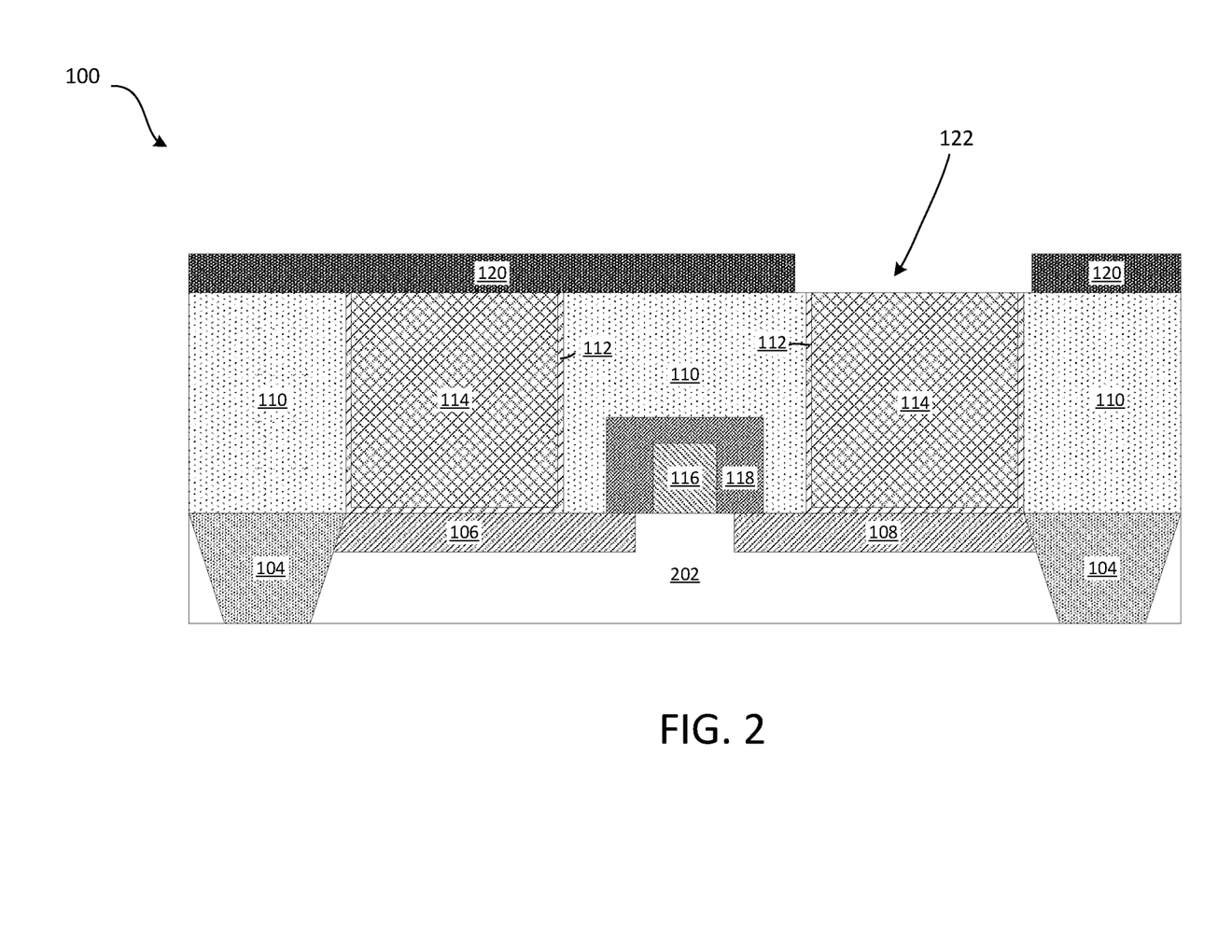
FIG. 2 is a cross-sectional view of the ReRAM device of FIG. 1 at a subsequent stage of the manufacturing process, according to embodiments.

Referring now to FIG. 2, this figure is a cross-sectional view of the ReRAM device 100 of FIG. 1 at a subsequent stage of the manufacturing process, according to embodiments. As shown in FIG. 2, a via opening 122 is formed into the first SiN layer 120. The via opening 122 may be formed by an RIE process or by any other suitable material removal process.

Figure 3:
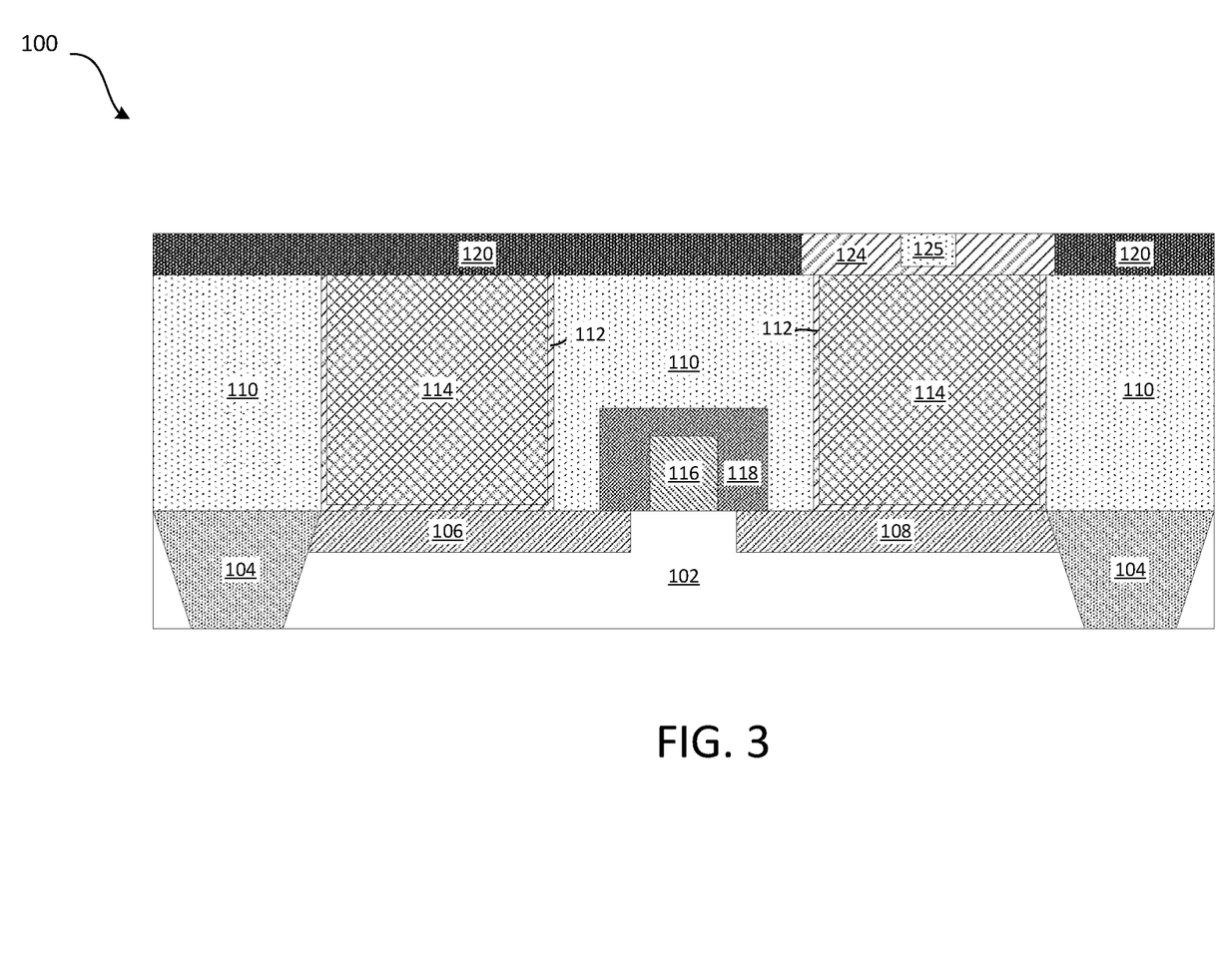
FIG. 3 is a cross-sectional view of the ReRAM device of FIG. 2 at a subsequent stage of the manufacturing process, according to embodiments.

Referring now to FIG. 3, this figure is a cross-sectional view of the ReRAM device of FIG. 2 at a subsequent stage of the manufacturing process, according to embodiments. As shown in FIG. 3, a liner layer 124 is formed to partially fill in the via opening 122. The liner layer 124 may comprise TiN or any other suitable material. The material of the liner layer 124 may be the same material as that of the via liner layer 112 described above with respect to FIG. 1, or it may be a different material. Because the liner layer 124 is formed to only partially fill the via opening 122, a space remains to allow for formation of the high WF metal layer 125. It may be considered that the high WF metal layer 125 (or high work function (WF) metal core) is embedded in (or formed in) the liner layer 124 (or resistive material layer). That is, certain methods of manufacturing a ReRAM device may including filling a portion of the via (or via opening 122) with the high resistive material layer (or liner layer 124), and then filling a remaining portion of the via opening 122 with the high work function metal core (or high WF metal layer 125) at a center of the first resistive structure (i.e., a combination of the liner layer 124 and the high WF metal layer 125). The high WF metal layer 125 may be comprised of, for example, Ru, or any other suitable high WF metal material (e.g., >4.9 eV) such as Jr or Pt. After the formation of the high WF metal layer 125, the ReRAM device 100 may be subjected to a CMP process to planarize the structure. As shown in FIG. 3, a width of the high WF metal layer 125 is less than the width of the via core 114. As described in further detail herein, the structure and material of the high WF metal layer 125 (e.g., the narrow width) enhances the electric field near the bottom electrode via core 114 during the electroforming and facilitates CF formation near the center of the device. Thus, problems associated with the randomness of CF formation discussed above may be lessened or eliminated.

Figure 4:
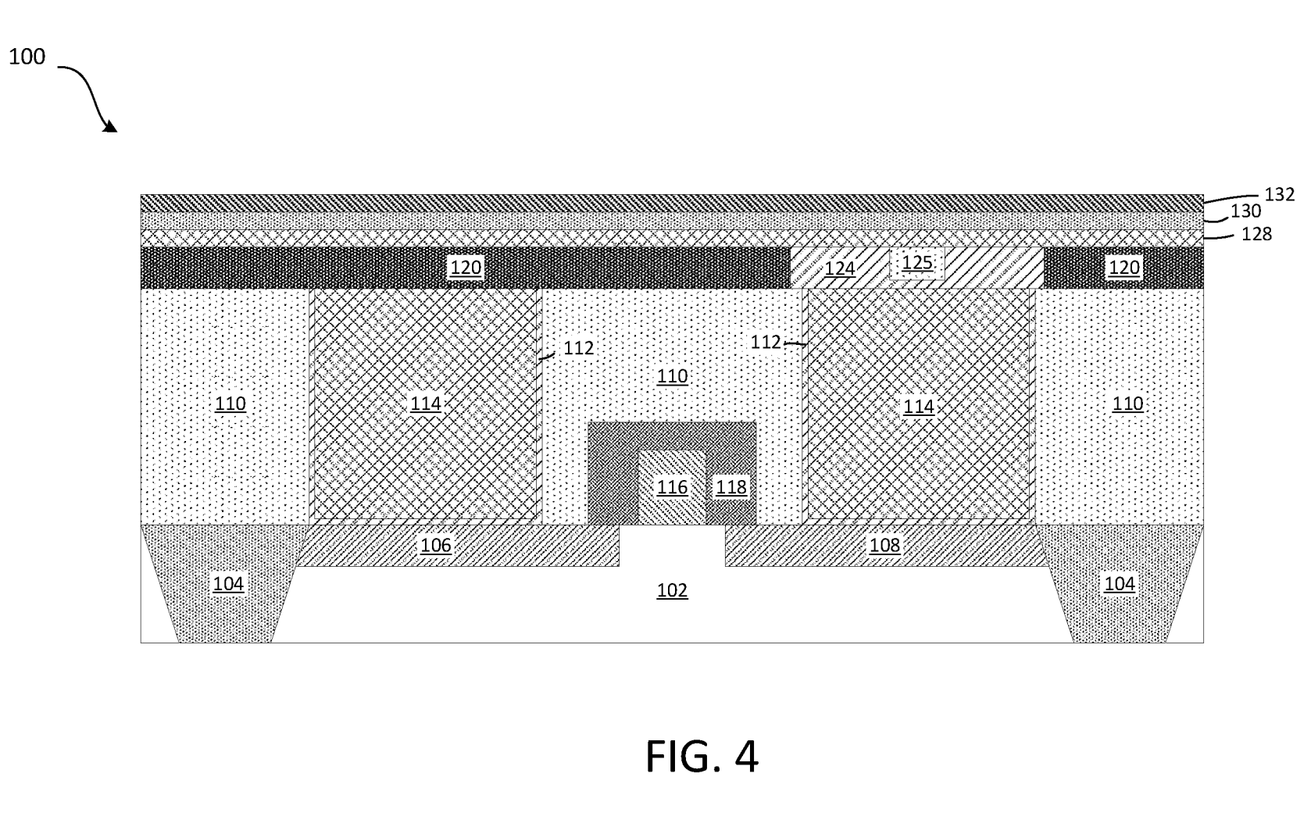
FIG. 4 is a cross-sectional view of the ReRAM device of FIG. 3 at a subsequent stage of the manufacturing process, according to embodiments.

Referring now to FIG. 4, this figure is a cross-sectional view of the ReRAM device 100 of FIG. 3 at a subsequent stage of the manufacturing process, according to embodiments. As shown in FIG. 4, a metal oxide layer 128 is initially formed over the entire ReRAM device 100. The metal oxide layer 128 may comprise $HfO_2$, or any other suitable metal oxide material or combination of metal oxide materials. A top electrode 130 is formed over the entire surface of the metal oxide layer 128. The top electrode 130 may comprise TiN or any other suitable material. The material of the top electrode 130 may be the same as, or different from, the material of the via liner layer 112 and/or the liner layer 124. A hardmask 132 is then deposed over the entire surface of the top electrode 130. The hardmask 132 may comprise SiN, or any other suitable material. The deposition of the hardmask 132 material may include any deposition process such as, for example, chemical vapor deposition or plasma enhanced chemical vapor deposition.

Figure 5:
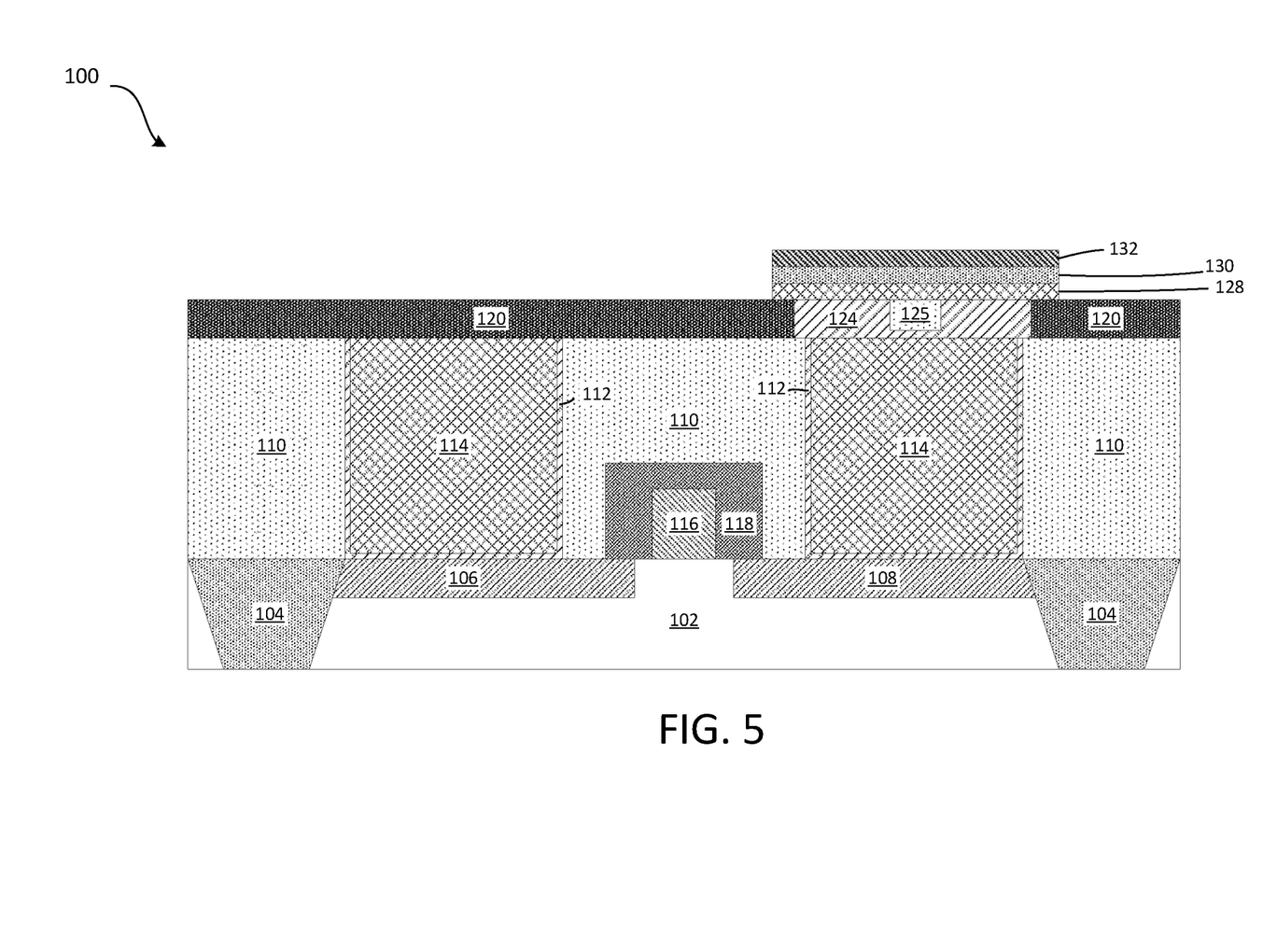
FIG. 5 is a cross-sectional view of the ReRAM device of FIG. 4 at a subsequent stage of the manufacturing process, according to embodiments.

Referring now to FIG. 5, this figure is a cross-sectional view of the ReRAM device 100 of FIG. 4 at a subsequent stage of the manufacturing process, according to embodiments. As shown in FIG. 5, etching is performed on the hardmask 132 layer, the top electrode 130 and the metal oxide layer 128 to pattern these layers into a ReRAM pillar. In certain examples, for ease of manufacturing integration, the width of the patterned hardmask 132 layer, the top electrode 130 and the metal oxide layer 128 may be slightly larger than a width of the bottom electrode structure to prevent inadvertent etching of the liner layer 124.

Figure 6:
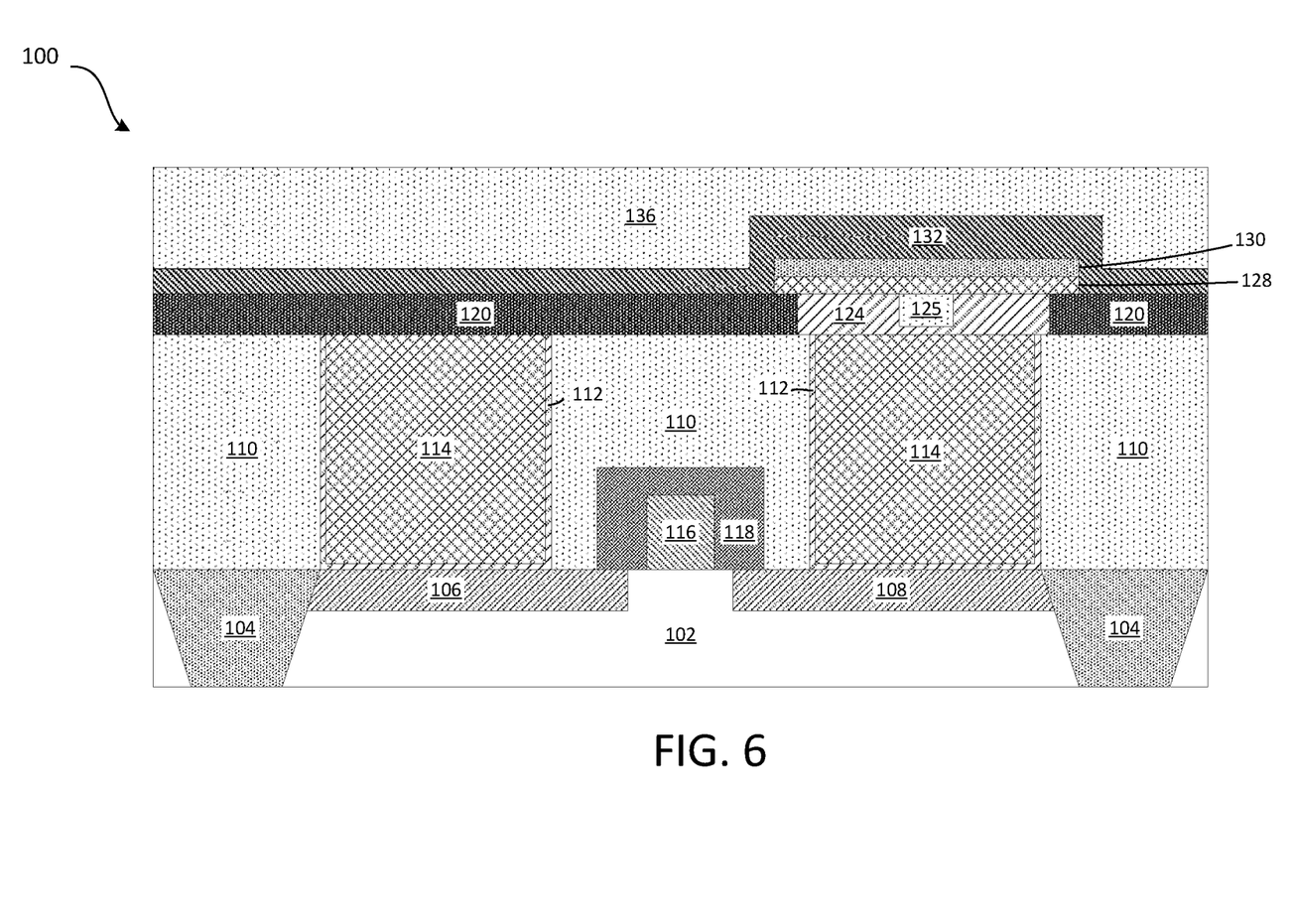
FIG. 6 is a cross-sectional view of the ReRAM device of FIG. 5 at a subsequent stage of the manufacturing process, according to embodiments.

Referring now to FIG. 6, this figure is a cross-sectional view of the ReRAM device of FIG. 5 at a subsequent stage of the manufacturing process, according to embodiments. As shown in FIG. 6, additional material (e.g., SiN) is added to extend the hardmask 132 and form an encapsulation layer over the entire surface of the ReRAM device 100. The hardmask 132 may comprise, for example, SiN, or any other suitable material. Then, a second ILD layer 136 may be deposited over the entire surface of the hardmask 132. It should be appreciated that although the hardmask 132 is shown as a single layer, it may be that a separate encapsulation layer (i.e., of a material other than that of the hardmask 132) may be formed over the hardmask 132. The second ILD layer 136 may comprise In certain embodiments, following the formation of the second ILD layer 136, the ReRAM device 100 is subjected to a CMP process to planarize the surface of the device.

Figure 7:
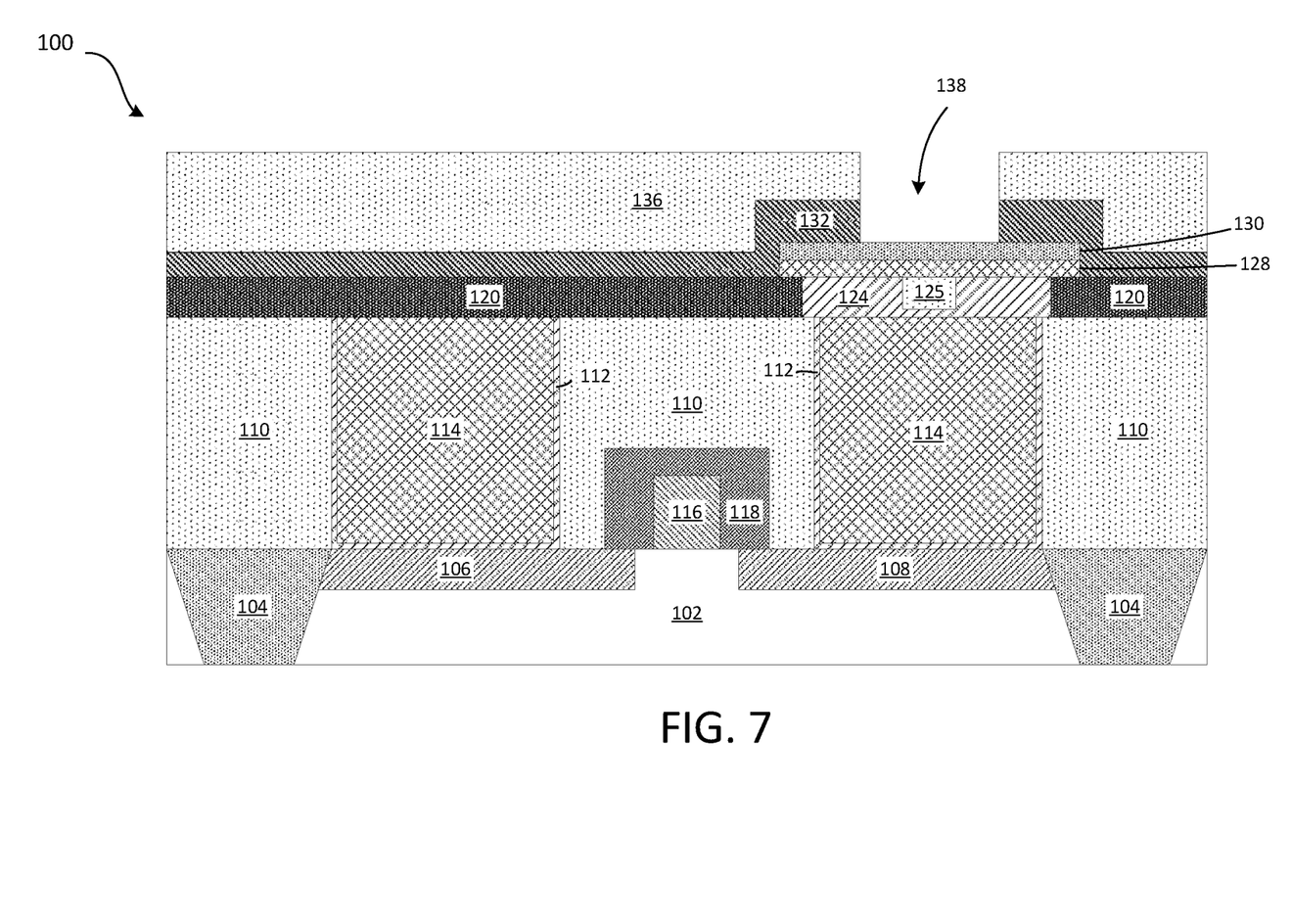
FIG. 7 is a cross-sectional view of the ReRAM device of FIG. 6 at a subsequent stage of the manufacturing process, according to embodiments.

Referring now to FIG. 7, this figure is a cross-sectional view of the ReRAM device of FIG. 6 at a subsequent stage of the manufacturing process, according to embodiments. As shown in FIG. 7, a contact via 138 is formed by etching through the second ILD layer 136 and the hardmask 132. The contact via 138 may accommodate the formation of the top electrode.

Figure 8:
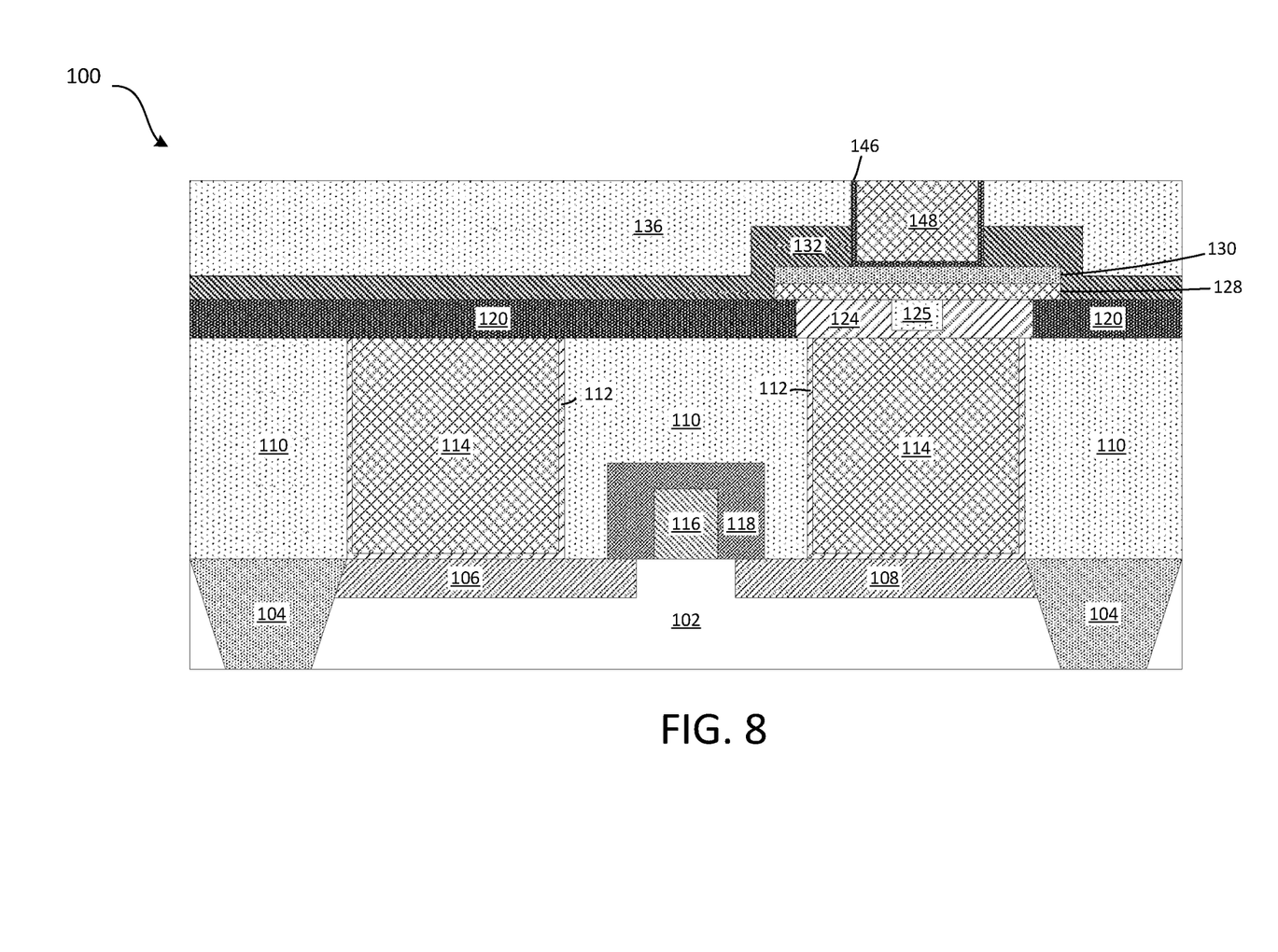
FIG. 8 is a cross-sectional view of the ReRAM device of FIG. 7 at a subsequent stage of the manufacturing process, according to embodiments.

Referring now to FIG. 8, this figure is a cross-sectional view of the ReRAM device of FIG. 7 at a subsequent stage of the manufacturing process, according to embodiments. As shown in FIG. 8, the top electrode includes a top electrode via liner layer 146 and a top electrode via core 148. The top electrode via liner layer 146 may include TaN or TiN, or any other suitable material. The top electrode via core 148 may include, for example, W. After the formation of the top electrode, the ReRAM device 100 may be subjected to a chemical-mechanical planarization (CMP) to planarize the upper surface of the device.

Figure 9:
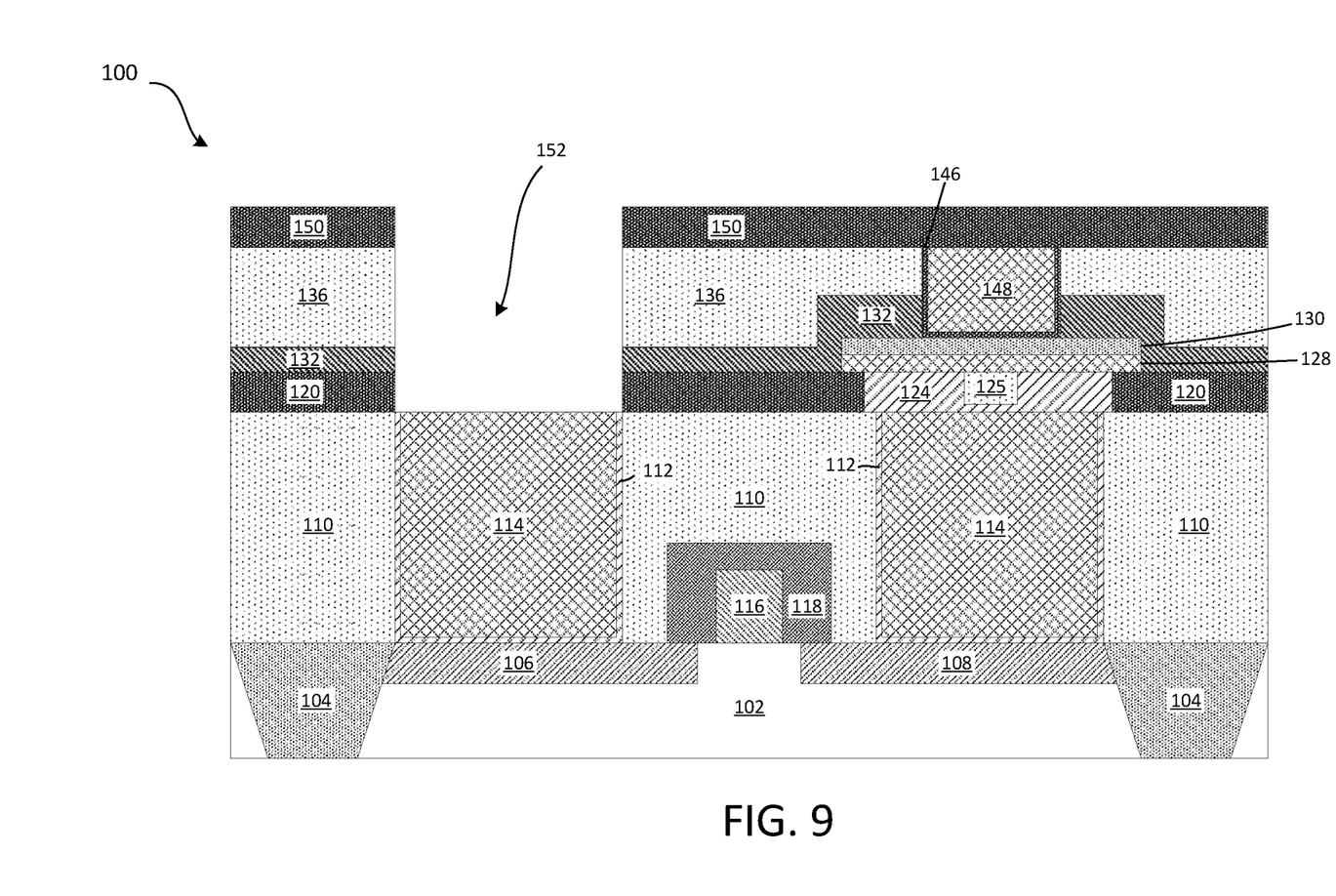
FIG. 9 is a cross-sectional view of the ReRAM device of FIG. 8 at a subsequent stage of the manufacturing process, according to embodiments.

Referring now to FIG. 9, this figure is a cross-sectional view of the ReRAM device of FIG. 8 at a subsequent stage of the manufacturing process, according to embodiments. As shown in FIG. 9, a second SiN layer 150 is deposed over the entire surface of the ReRAM device 100. Then, a periphery contact via 152 is formed by etching through the second SiN layer 150, the second ILD layer 136, the hardmask 132 and the first SiN layer 120 to expose the via core 114.

Figure 10:
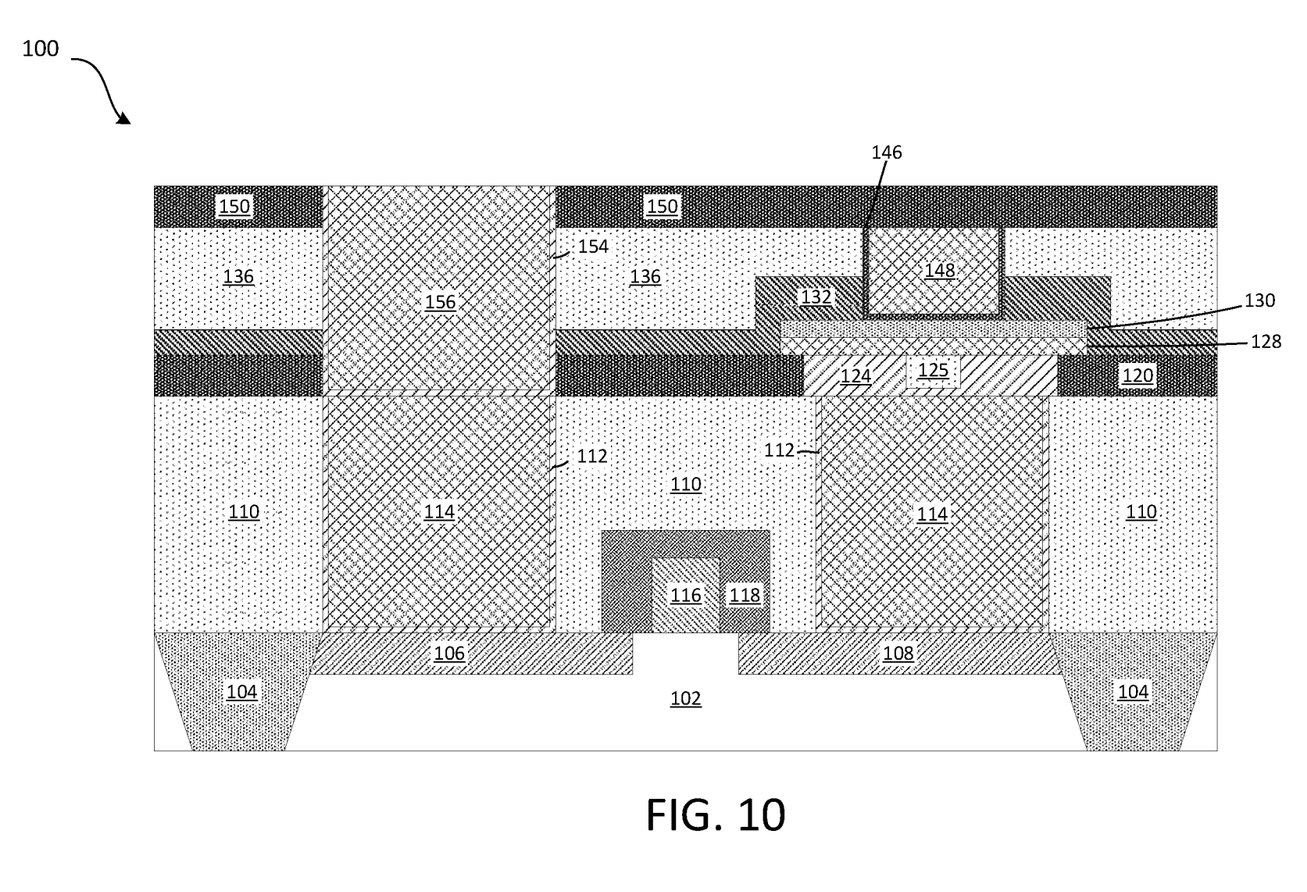
FIG. 10 is a cross-sectional view of the ReRAM device of FIG. 9 at a subsequent stage of the manufacturing process, according to embodiments.

Referring now to FIG. 10, this figure is a cross-sectional view of the ReRAM device of FIG. 9 at a subsequent stage of the manufacturing process, according to embodiments. As shown in FIG. 10, after the formation of the periphery contact via 152, a periphery contact via liner layer 154 is deposited The periphery contact via liner layer 154 may include TaN or TiN, or any other suitable material. The periphery contact via core 156 may include, for example, W. After the formation of the periphery contact, additional material is added to the second SiN layer 150 to cover the upper surface of the periphery contact via core 156. Then, in certain examples, the ReRAM device 100 may be subjected to a chemical-mechanical planarization (CMP) to planarize the upper surface of the device.

By having a high work function metal core layer having a narrower width then the bottom electrode, the location of the formation of the conductive filament (CF) can be controlled to correspond with that position, removing some of the randomness related to the formation location of the CF. Also, by allowing the conductive filament to be localized (or centralized), an amount of voltage that needs to be applied to change the resistive state from a high resistance state to a low resistance state may be reduced.

In the embodiments described above, the high work function metal core layer is described as being formed in the bottom electrode (i.e., the electrode closest to the underlying substrate). However, it should be appreciated that in other embodiments, the high WF metal core layer may be formed in the top electrode, or in both the top and bottom electrodes.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive random access memory (ReRAM) device comprising:
    a first electrode;
    a first resistive structure in contact with the first electrode;
    a dielectric layer in contact with the first resistive structure;
    a second resistive structure in contact with the dielectric layer, the second resistive structure including a resistive material layer and a high work function metal core; and
    a second electrode in contact with the second resistive structure.

2. The ReRAM device of claim 1, wherein the high work function metal core comprises at least one selected from the group consisting of Ru, Jr and Pt.

3. The ReRAM device of claim 1, wherein the high work function metal core has a width that is less than a width of the first electrode and a width of the second electrode.

4. The ReRAM device of claim 3, wherein the high work function metal core is positioned at a center of the second resistive structure.

5. The ReRAM device of claim 1, wherein the high work function metal core is embedded in the resistive material layer.

6. The ReRAM device of claim 1, wherein the dielectric layer comprises a metal oxide material.

7. The ReRAM device of claim 6, wherein the metal oxide material is $HfO_2$.

8. The ReRAM device of claim 1, wherein the high work function metal core has a work function of >4.9 eV.

9. The ReRAM device of claim 1, further comprising an encapsulation layer formed over the first electrode, and an interlayer dielectric layer formed over the encapsulation layer.

10. The ReRAM device of claim 1, wherein the first electrode and the second electrode each include a liner layer, and a via core formed on the liner layer.

11. A method of fabricating a resistive random access memory (ReRAM) device comprising:
forming a first electrode;
forming a first resistive structure in contact with the first electrode;
forming a dielectric layer in contact with the first resistive structure;
forming a second resistive structure in contact with the dielectric layer; and
forming a second electrode in contact with the second resistive structure,
wherein the first resistive structure included a resistive material layer and a high work function metal core.

12. The method of fabricating the ReRAM device of claim 11, wherein the high work function metal core comprises at least one selected from the group consisting of Ru, Ir and Pt.

13. The method of fabricating the ReRAM device of claim 11, wherein the high work function metal core has a width that is less than a width of the first electrode and a width of the second electrode.

14. The method of fabricating the ReRAM device of claim 13, wherein forming the first resistive structure includes:
forming a SiN layer on the first electrode;
etching a via in the SiN layer;
filling a portion of the via with the high resistive material layer; and
filling a remaining portion of the via with the high work function metal core at a center of the first resistive structure.

15. The method of fabricating the ReRAM device of claim 11, wherein the high work function metal core is embedded in the resistive material layer.

16. The method of fabricating the ReRAM device of claim 11, wherein the dielectric layer comprises a metal oxide material.

17. The method of fabricating the ReRAM device of claim 16, wherein the metal oxide material is $HfO_2$.

18. The method of fabricating the ReRAM device of claim 11, wherein the high work function metal core has a work function of >4.9 eV.

19. The method of fabricating the ReRAM device of claim 11, further comprising forming an encapsulation layer over the second resistive structure and forming an interlayer dielectric layer over the encapsulation layer.

20. The method of fabricating the ReRAM device of claim 11, wherein the first electrode and the second electrode each include a liner layer, and a via core formed on the liner layer.

* * * * *